United States Patent [19]

Takeuchi

[11] Patent Number: 4,499,662

[45] Date of Patent: Feb. 19, 1985

[54] INJECTION MOLDING METHOD FOR MAKING A SWITCH

[75] Inventor: Tetsuo Takeuchi, Ohmiya, Japan

[73] Assignee: Sony Corporation, Tokyo, Japan

[21] Appl. No.: 560,260

[22] Filed: Dec. 12, 1983

Related U.S. Application Data

[63] Continuation of Ser. No. 335,152, Dec. 28, 1981, abandoned.

[30] Foreign Application Priority Data

Dec. 27, 1980 [JP] Japan ................................. 55-186668

[51] Int. Cl.³ ...................... B29C 17/00; H01H 11/00; B29F 1/10
[52] U.S. Cl. ........................................ 29/622; 29/458; 29/522; 264/135; 264/320; 264/334
[58] Field of Search ............... 200/5 C, 159 A, 159 B; 29/622, 509, 522, 458; 264/245, 246, 259, 320, 248, 249, 334, 135

[56] References Cited

U.S. PATENT DOCUMENTS

| | | | |
|---|---|---|---|
| 3,176,057 | 3/1965 | Peters et al. | 264/259 |
| 3,246,066 | 4/1966 | Gits | 264/135 |
| 3,839,129 | 10/1974 | Neumann | 264/135 |
| 3,969,175 | 7/1976 | Posner | 264/135 |
| 4,016,235 | 4/1977 | Ferro | 264/135 |
| 4,073,854 | 2/1978 | Burry | 264/247 |
| 4,110,393 | 8/1978 | Trame | 264/135 |
| 4,205,036 | 5/1980 | Trame | 264/135 |
| 4,368,168 | 1/1983 | Slepcevic | 264/334 |
| 4,395,817 | 8/1983 | Asada et al. | 264/135 |

Primary Examiner—Willard E. Hoag
Attorney, Agent, or Firm—Lewis H. Eslinger; Alvin Sinderbrand

[57] ABSTRACT

For providing a molded body in the form of a predetermined pattern projecting from a surface of a substrate, such as, a flexible metal sheet, the substrate surface is first coated with a thermoplastic film and then applied against a mold plate which has a cavity in the form of the predetermined pattern opening toward the thermoplastic film, whereupon, a resin, such as, polyethylene, is injected into the cavity to form on the substrate an injection molded body having the predetermined pattern and which is bonded to the substrate through the thermoplastic film in consequence of the heat and pressure incidental to the injection molding process.

6 Claims, 13 Drawing Figures

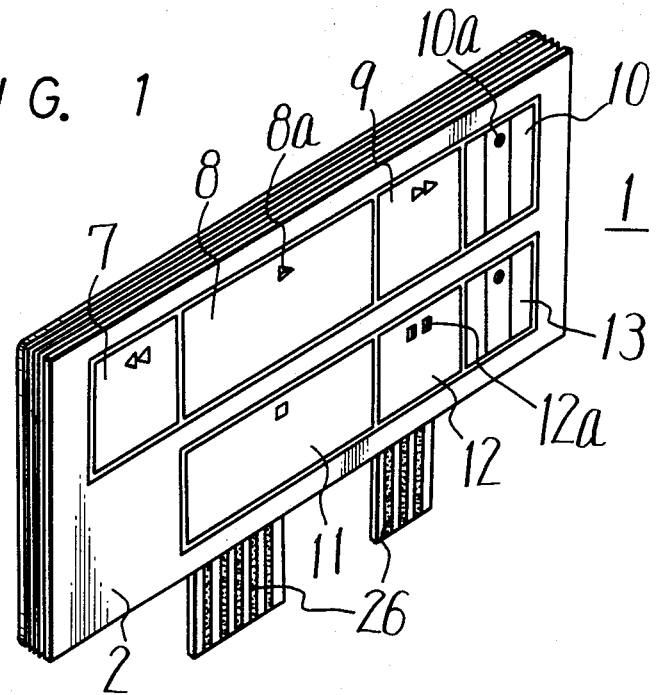
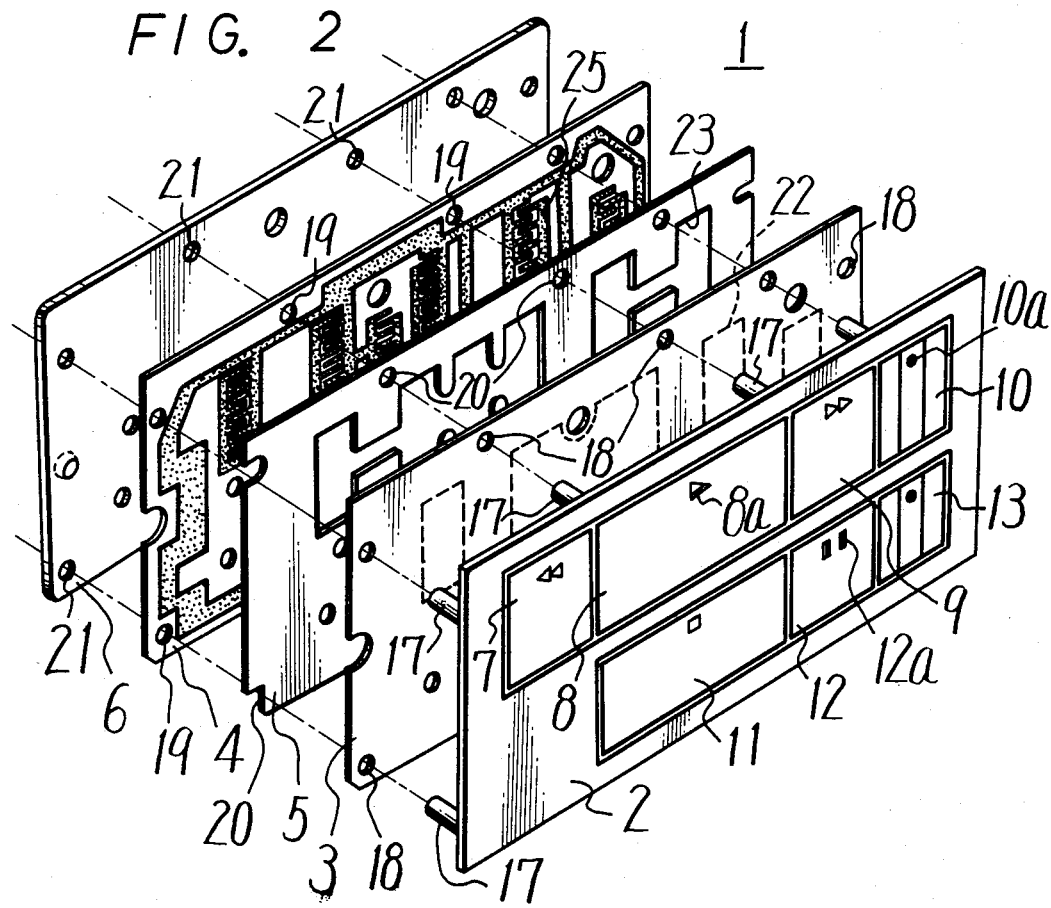

INJECTION MOLDING METHOD FOR MAKING A SWITCH

This is a continuation of application Ser. No. 061,335,152, filed Dec. 28, 1981, now abandoned.

BACKGROUND OF THE INVENTION

1. Field of the Invention

This invention relates to an injection molding method and article formed thereby, and more particularly is directed to the injection molding on a substrate surface of a molded body in the form of a predetermined pattern.

2. Description of the Prior Art

Conventional switching devices having a plurality of switching members are usually constructed with switch actuating push buttons formed independently of each other and assembled so as to normally lie in a common plane. Such conventional switching devices are, as is apparent, formed of numerous components or parts, so that the manufacture of such parts and the assembling together thereof are complicated and costly procedures. Further, in the case of such conventional switching devices, it is difficult to ensure that the several push buttons will, in their normal or rest positions, be disposed in precisely the same plane, and the failure of the push buttons, in their normal or rest positions, to reside in precisely the same plane detracts from the appearance of the switching device.

In order to avoid the foregoing disadvantages of the conventional switching devices constructed of individually formed push-buttons, it has been proposed to provide a planar, push-type switching device in the form of a laminated structure comprised of a resiliently flexible front panel having regions thereof corresponding to respective switching members, and which are adapted to be individually depressed or pushed for closing or engaging respective contacts provided on other layers or sheets of the laminated structure. However, the existing method for making the described planar push-type switching device, and particularly for making the front panel thereof, has not been susceptible to economical mass production.

OBJECTS AND SUMMARY OF THE INVENTION

Accordingly, it is an object of this invention to provide an injection molding method which, which applied to the production of, for example, the front panel of a planar, push-type switching device, makes it posssible to conveniently and economically realize the mass production thereof.

Another object is to provide a substrate, for example, of resiliently flexible sheet metal, to which there is securely bonded a molded body which may form a predetermined pattern of complex character and project various distances from the substrate surface.

In accordance with an aspect of the invention, for providing a molded body in the form of a predetermined pattern projecting from a surface of a substrate, such surface is coated with a thermoplastic film, the surface coated with thermoplastic film is disposed against a mold plate having a cavity in the form of the desired or predetermined pattern and which opens toward the thermoplastic film, and material, such as, a suitable resin, for example, polyethylene, is injected into the cavity to form on the substrate through the thermoplastic film a molded body having the predetermined pattern. In such method, according to to the invention, it will be appreciated that the injection molded body is bonded to the metal or other substrate through the thermoplastic film in consequence of the heat and pressure which is incidental to the injection molding process, and no further heat or pressure needs to be applied to effect the secure bond.

The above, and other objects, features and advantages of the invention, will be apparent from the following detailed description of an illustrative embodiment of the invention which is to be read in connection with the accompanying drawings in which the same reference numerals are employed for identifyig corresponding elements in the several views.

BRIEF DESCRIPTION OF THE DRAWINGS

FIG. 1 is a perspective view of an example of a planar, push-type switching device to which the present invention may be applied;

FIG. 2 is an exploded perspective view of the various components included in the switching device of FIG. 1;

DESCRIPTION OF THE PREFERRED EMBODIMENT

Figure 3:
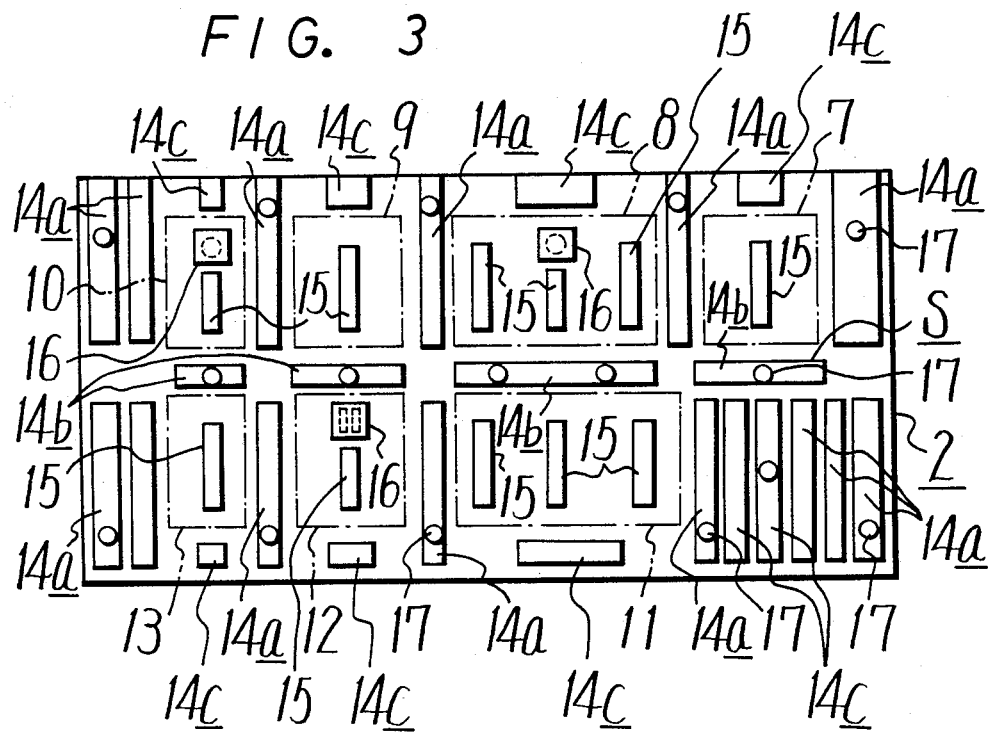
FIG. 3 is a rear elevational view of a front panel included in the switching device of FIGS. 1 and 2.
Figure 4:
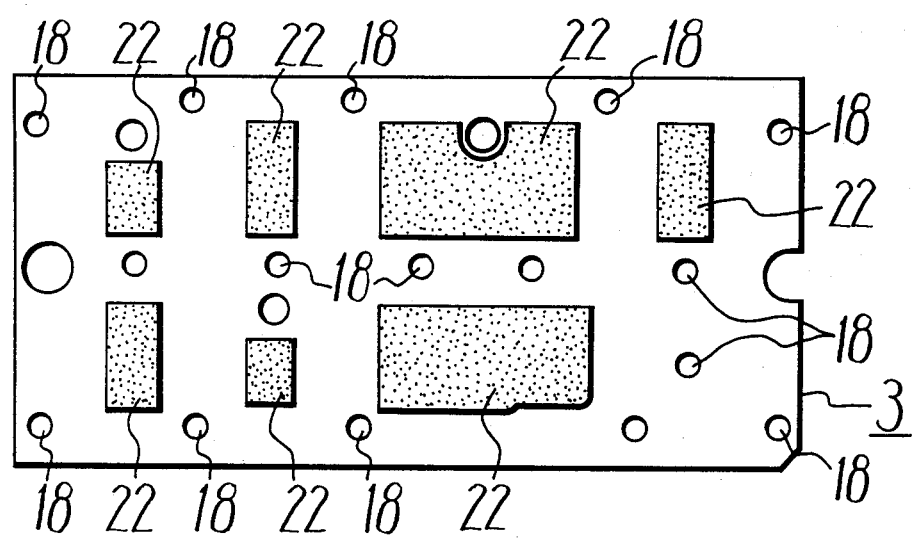
FIG. 4 is a rear elevational view of an insulating sheet acting as one of the contacts for each switch section in the switching device of FIGS. 1 and 2.

Before describing the invention in detail, reference will be made to FIGS. 1–6 for the illustration therein of a planar, push-type switching device 1 of a kind to which the invention may be advantageously applied. Such planar, push-type switching device 1 is shown to be constituted by a laminated structure comprised of a front panel 2, insulating sheets 3 and 4, which, as hereinafter described in detail, have conductive areas adapted to form first and second contacts of respective switch sections in device 1, an insulating sheet 5 interposed between insulating sheets 3 and 4 and acting as a spacer, and a reinforcing or back-up plate 6 (FIG. 2). The switching device 1, as shown on FIG. 1, is intended to be used for selecting the various operating modes of a tape recorder. Thus, by way of example, the illustrated switching device 1 has its front panel 2 pictorially divided into areas or regions 7, 8, 9, 10, 11, 12 and 13 which can be selectively depressed or flexed rearwardly for closing respective switch section, of device 1, for example, to select the rewinding mode, the reproducing mode, the fast-forward mode, the recording mode, the stop mode, the pause mode, and the non-signal recording mode, respectively, of an associated tape recorder. The front panel 2 may be formed of a thin metal sheet, for example, of stainless SUS steel, which is suitably flexible to permit the individual or independent resilient flexing of the various described areas or regions of the panel. Further, as shown, areas or regions 8, 10 and 12 for selecting the reproducing, recording and pause modes, respectively, may have display windows 8a, 10a and 12a, respectively, formed therein through which lamp devices or the like may emit light for indicating when the respective mode has been selected.

As shown particularly on FIG. 3, the rear surface of front panel 2 has a pattern S of projections extending therefrom at the boundaries of the areas or regions 7-13 for dividing the latter one from the other. More particularly, there are elongated spacing projections 14a extending vertically between the areas or regions of panel 2 which are laterally adjacent each other, for example, between areas or regions 7 and 8, regions 8 and 9, and regions 9 and 10, and also extending vertically between the regions 7 and 10, and 11 and 13 which are at the opposite ends of the upper and lower rows and the adjacent side edges of panel 2. Elongated spacing projections 14b also extend horizontally on panel 2 between the regions 7-10 in the upper row and regions 11-13 in the lower row. Still other spacing projections 14c are provided along the upper and lower margins of panel 2 at locations corresponding to the regions or sections 7-10 and the regions or sections 11-13, respectively. It will be seen that the spacing projections 14a and 14b have lengths which are approximately at least as long as the dimensions of the respective areas or regions 7-13 along which such projections 14a and 14b extend. On the other hand, the spacing projections 14c are relatively short, that is, have lengths substantially smaller than the dimensions of the regions 7-13 along which such projections 14c respectively extend.

Further, as shown on FIG. 3, pattern S includes one or more operational projections 15 extending rearwardly from panel 2 for each of the regions 7-13 thereof. The pattern S also includes a display projection 16 at each of the positions on panel 2 corresponding to the windows 8a, 10a and 12a in regions 8, 10 and 12, respectively. Moreover, at least some of the spacing projections 14a and 14b are formed with posts 17 directed rearwardly therefrom and being engageable in correspondingly positioned holes 18, 19, 20 and 21 formed in sheets 3, 4 and 5 and in backing or reinforcing plate 6, respectively, for maintaining a fixed positional relationship of panel 2, sheets 3, 4 and 5 and backing plate 6. The spacing projections 14c provided along the upper and lower edge portions of front panel 2 desirably project rearwardly from panel 2 a smaller distance than the other spacing projections 14a and 14b. Thus, when one of the regions 7-13 of panel 2 is pressed rearwardly, such region can flex rearwardly between the adjacent spacing portions 14a until the adjacent projection 14c comes into contact with the adjacent marginal portion of sheet 3 for limiting the rearward stroke of the region of panel 2 being depressed. During such depression of a selected one of regions 7-13, the bounding spacing projections 14a and 14b serve to isolate the rearward flexing of the region being depressed from the adjacent regions of panel 2 so as to avoid misoperation of the switch section adjacent the switch section being actuated.

Each of insulating sheets 3, 4 and 5 may be formed of a suitable plastic or resin, for example, polyester, so as to be resiliently flexible from a normally flat condition. The insulating sheet 3 is provided, on its rear surface, with conductive layers 22 (FIG. 4) extending over areas thereof corresponding to the areas or regions 7-13 of front panel 2. Such conductive layers 22 may be formed of a carbon ink printed on sheet 3, and it is intended that each conductive layer 22 will provide a bridging contact for the respective switching section.

Figure 5:
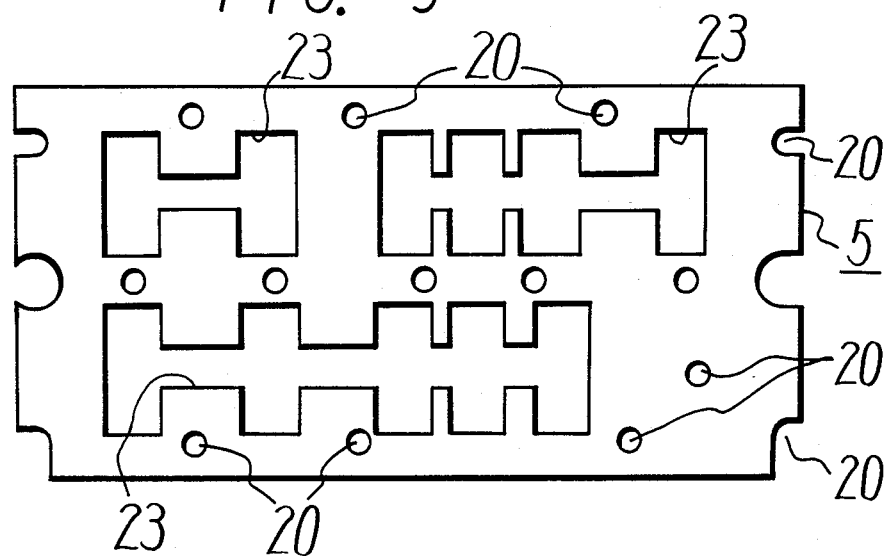
FIG. 5 is a rear elevational view of an insulating sheet acting as a spacer in the switching device of FIGS. 1 and 2.

As shown on FIG. 5, the insulating sheet 5 disposed in back of insulating sheet 3 has cutouts or windows 23 at positions corresponding to respective operational projections 15 extending from front panel 2.

Figure 6:
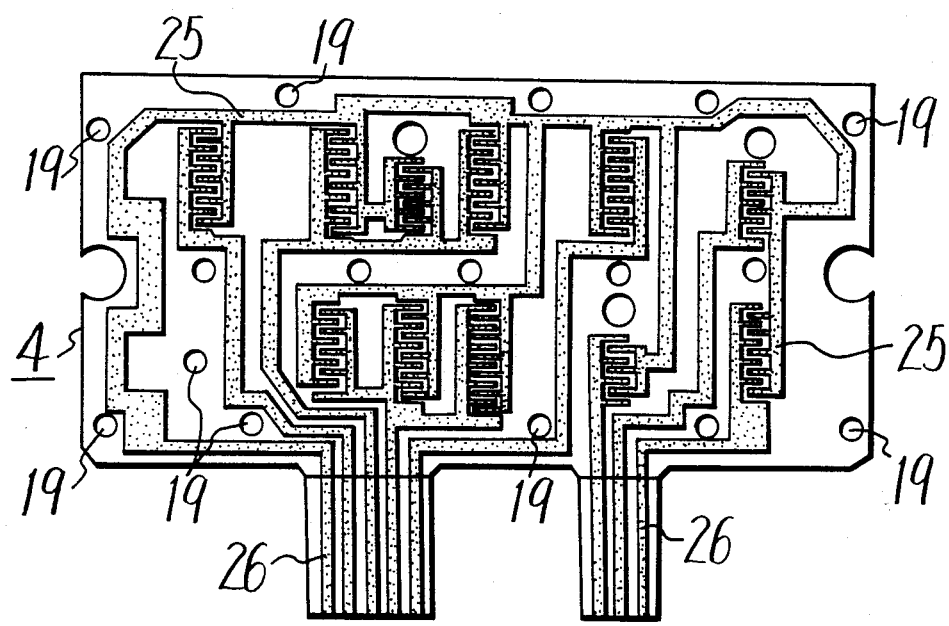
FIG. 6 is a front elevational view of an insulating sheet acting as the other contact for each switch section in the switching device of FIGS. 1 and 2.

As shown on FIG. 6, insulating sheet 4 is provided, on its front surface, with a conductive pattern 25, for example, of carbon, printed thereon. Such pattern 25 constitutes a printed circuit which, for each switch section of device 1, includes a contact arrangement having spaced apart portions and being registered with the operational projection 15 associated with a respective one of the areas or regions 7-13 on panel 2. As further shown on FIG. 6, the printed circuit 25 on insulating sheet 4 includes terminal portions 26 which lead out from the assembled switched device 1 (FIG. 1).

After insulating sheets 3, 4 ad 5 and backing plate 6 have been installed on posts 17 at the back of front panel 2 in the order shown on FIG. 2, the free ends of posts 17 may be headed or deformed so as to hold sheets 3-5 and plate 6 close against each other and against spacing projections 14a and 14b on the back of panel 2. Thereafter, when any one of regions 7-13 of front panel 2 is pressed and thereby made to flex rearwardly between the adjacent projections 14a, the respective operational projection 15 acts against insulating sheet 3 and similarly deflects the latter rearwardly at a location corresponding to the respective conductive layer 22 which is thereby pushed through the respective window 23 in sheet 5 for engaging a corresponding contact defining portion of the printed conductive pattern 25 on sheet 4. Thus, the portion of a conductive layer 22 on sheet 3 which is made to reach through a corresponding window 3 in sheet 5 for engagement with printed circuit 25 is effective to bridge the otherwise spaced apart contact portions of circuit 25 for establishing the closed state of the respective switch section. When the pressure exerted against a selected one of the regions 7-13 of front panel 2 is removed or relaxed, the resiliently flexible panel 2 and insulating sheet 3 return to their original flat condition, with the result that the respective switch section is returned to its normal opened condition. Accordingly, the opening and closing of the switch sections of device 1 associated with the areas or regions 7-13 of front panel 2 can be effected merely by pushing a selected one of regions 7-13 to deflect or depress the same, and then removing the pressure from the selected region.

Although the above described planar, push-type switching device 1 is a very substantial improvement over earlier employed control panels made up of individually formed push-button actuated switch mechanisms, in that the front panel 2, sheets 3-5 and backing plate 6 are common to the several switch sections and are easily and quickly assembled together to provide switching device 1, the existing method for producing front panel 2 does not make possible the full enjoyment of the advantages of mass production thereof.

Figure 7:
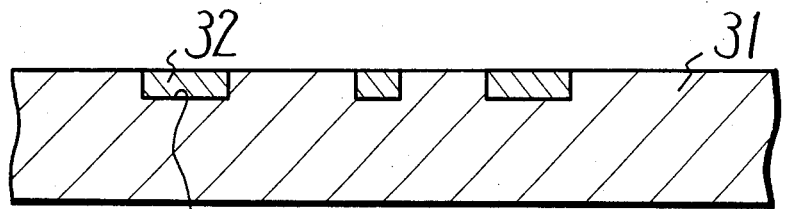
FIGS. 7, 8 and 9 are schematic, sectional views to which reference will be made in explaining the successive steps in a method according to the prior art for providing the front panel of FIG. 3.
Figure 8:
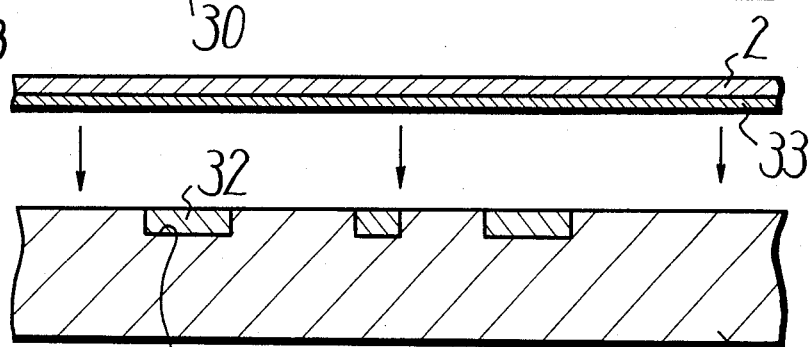
Figure 9:
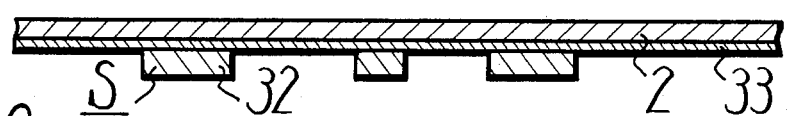

In such existing method for producing front panel 2, recesses 30, which correspond to the projections 14a, 14b, 14c, 15, 16 and 17 of the desired pattern S, are provided in a mold 31 (FIG. 7) and are filled with a suitable resin, as indicated at 32. Thereafter, an adhesive coating is applied, as a primer, over the surface of mold 31, and hence over the surface of the resin 32 in recesses 30. Then, a thermoplastic sheet or film 33, for example, of an acrylate, is applied to the back surface of panel 2 and, as shown on FIG. 8, the back surface of panel 2, with the thermoplastic film or sheet 33 thereon, is applied against the adhesive coated surface of mold 31 and of the resin 32 in recesses 30, whereupon the resulting assembly is heated and pressed together for joining panel 2 through thermoplastic film 33 to the resin 32 in recesses 30. Finally, panel 2 is peeled off mold 31 so as to take with it the resin 32 previously filling recesses 30. The resulting front panel 2 has the thermoplastic sheet or film 33 on its rear surface with the resin projections 32 extending therefrom in the form of the pattern S, as shown on FIG. 9. However, the foregoing method for producing the pattern S of projections on the back surface of panel 2 is disadvantageous in that the molding cycle requires about three-quarters of an hour for its completion, primarily due to the need to apply heat and pressure for bonding the previously molded resin 32 in recesses 30 to panel 2 through thermoplastic film or sheet 33. Such relatively lengthy period of time required for each molding cycle substantially interferes with the attainment of the full advantages of mass production of the switching device 1, even in the event that the mold 31 is formed so as to permit the simultaneous formation therein of the projection patterns for a number of the front panels, for example, for as many as six front panels 2.

Generally, in accordance with the present invention, the above problem associated with the production of the projecting pattern S on the back surface of panel 2 is avoided by injection molding such projecting pattern S directly against the thermoplastic film on panel 2 so that, as a result of the heat and pressure incidental to the injection molding process, the molded projecting pattern S will be bonded through the thermoplastic film to the panel or substrate.

As is shown on FIG. 10, when the method according to the present invention, is applied to the provision of a projecting pattern S' on a front panel 2' for a switching device which is otherwise identical with the switching device 1 described above with reference to FIGS. 1-6, such projecting pattern S' includes all of the projections 14a, 14b, 14c, 15, 16 and 17 previously described with reference to FIG. 3 and, in addition thereto, connecting strips 40 which extend between the previously mentioned projections. The strips 40 are particularly seen to extend from each of the spacing projections 14a, 14b, and 14c having a post 17 associated therewith to the adjacent projections 14a, 14b, 14c, 15 and 16. Such connecting strips 40 are of relatively small cross section and have a height substantially less than that of any of the projections 14a, 14b, 14c, 15 and 16, as shown on FIG. 11.

Figure 10:
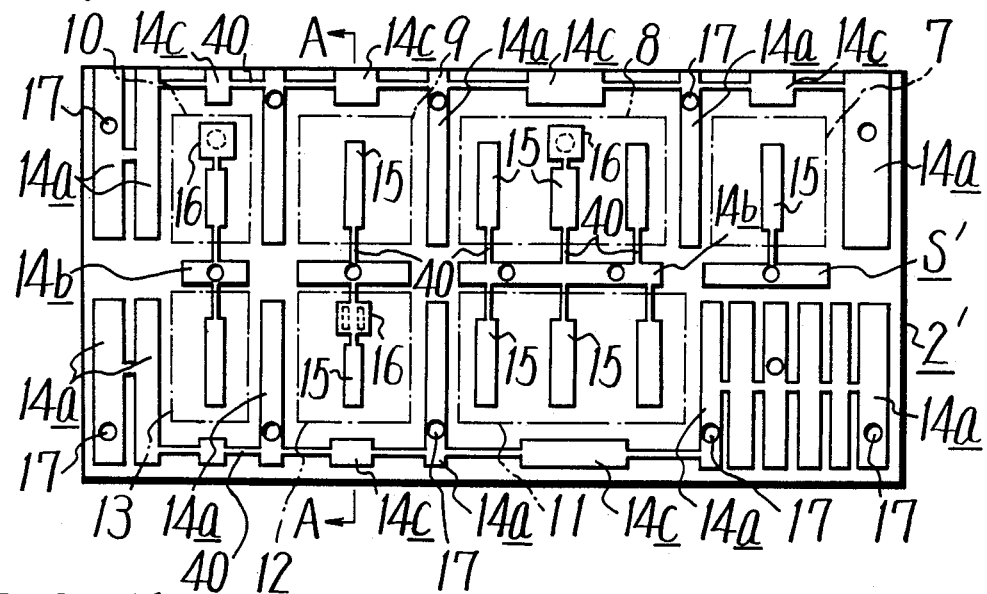
FIG. 10 is a rear elevational view, similar to that of FIG. 3, but showing the front panel of a planar, push-type switching device produced by an injection molding method according to the present invention.
Figure 11:
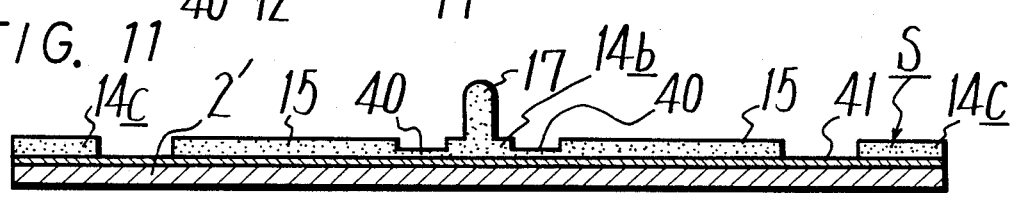
FIG. 11 is an enlarged, sectional view taken along the line A—A on FIG. 10.

As earlier mentioned, in the method according to the present invention, the projecting pattern S' of FIG. 10 is provided by injection molding a suitable resin, for example, polyethylene, directly into a mold cavity which opens against a thermoplastic film 41, for example, of ADOMER NEO 50 (trade name of a resin available from Mitui Sekiyu Kagaku Kogyo K.K.) which is based on a resin of the polyolefine series, or a thermoplastic resin of the EVA series or the like, and which has been previously applied to the back surface of panel 2'. Panel 2' may be formed of a stainless SUS sheet material which is sufficiently thin to be resiliently flexible. Since the injection molding is carried out against the thermoplastic film 41 on panel 2', the heat and pressure incidental to the injection molding is effective to cause bonding of the projecting pattern S' through the thermoplastic film 41 to the metal panel 2', without the need for applying further heat or pressure for that purpose.

Figure 12:
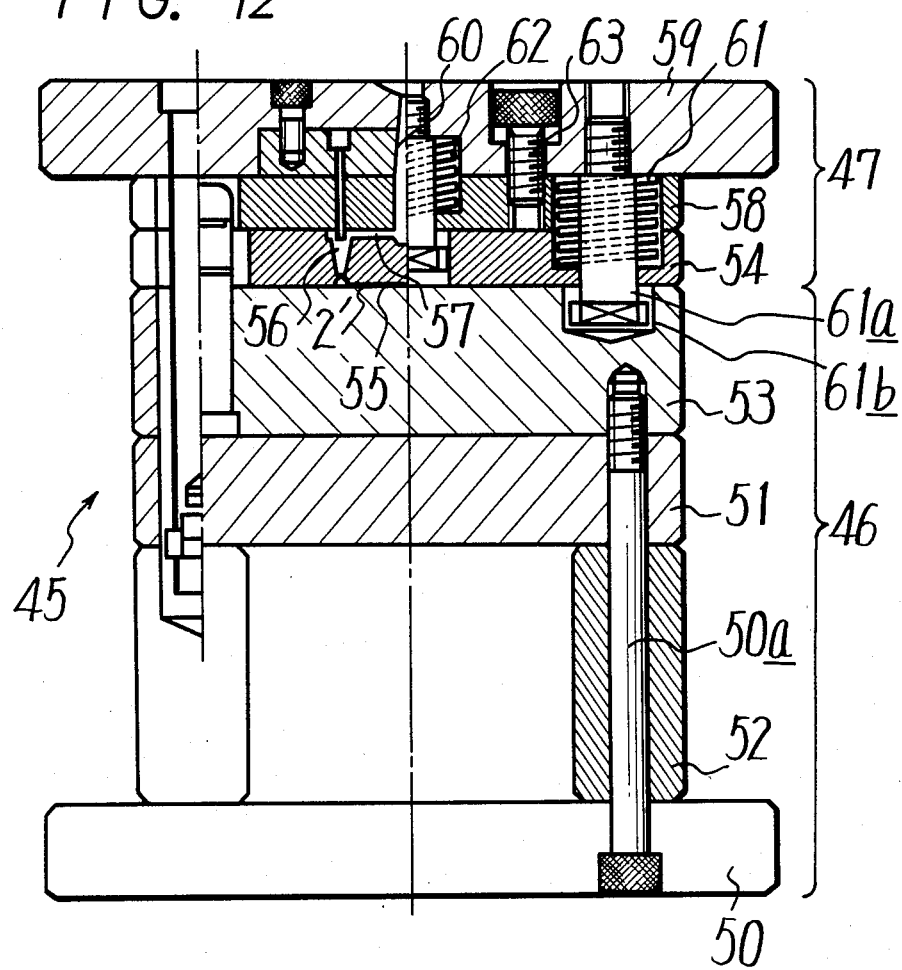
FIG. 12 is a diagrammatic vertical sectional view of a molding device by which the injection molding method according to the invention may be conveniently practiced.

Referring now to FIG. 12, it will be seen that the above described injection molding method according to this invention may be conveniently practiced in a molding apparatus 45 which generally comprises a lower, vertically movable assembly 46 and an upper stationary assembly 47. The movable assembly 46 is shown to include an attaching plate 50 which is suitably secured to a movable part of an injection molding machine (not shown), a receiving plate 51 spaced from attaching plate 50 by means of a spacer 52, and a mold plate 53 superposed on receiving plate 51. Plates 50, 51 and 53 and spacer 52 are secured to each other by means of bolts 50a. The upper or stationary assembly 47 includes a mold plate 54 having a cavity 55 in its lower surface which communicates with one or more gates 56 extending to the upper surface of mold plate 54 in which a runner 57 is formed with each gate 56 to a central location on the upper surface of mold plate 54. The upper or stationary assembly 47 further includes a runner stripper plate 58 disposed above mold plate 54, and an attaching plate 59 located above stripper plate 58 and being suitably attached to a stationary part of the injection molding machine. A central sprue 60 extends through attaching plate 59 and runner stripper plate 58 for communication, at its lower end, with each runner 57.

Compression springs, one of which is shown at 61, are provided for displacing mold plate 54 downwardly relative to runner stripper plate 58, and other compression springs, one of which is shown at 62, are provided for downwardly separating stripper plate 58 from attaching plate 59. More particularly, each spring 61 bears at its opposite ends against plates 54 and 59, and is shown to extend about a bolt 61a which is threadably attached, at its upper end, to attaching plate 59 and which extends slidably through plates 54 and 58 so that the downward movement of mold plate 54 relative to attaching plate 59 is limited by the engagement of plate 54 with the head at the lower end of each bolt 61a. The head of each bolt 61a is receivable in a correspondingly located recess 61b in the top surface of mold plate 53 when the mold is closed, that is, when movable assembly 46 is moved upwardly to engage the land area of mold plate 53 with the land area of mold plate 54. The downward movement of stripper plate 58 relative to attaching plate 59 is limited by bolts 63, each of which is threaded, at its lower end, into stripper plate 58, and is otherwise slidable in a bore in attaching plate 59.

Figure 13:
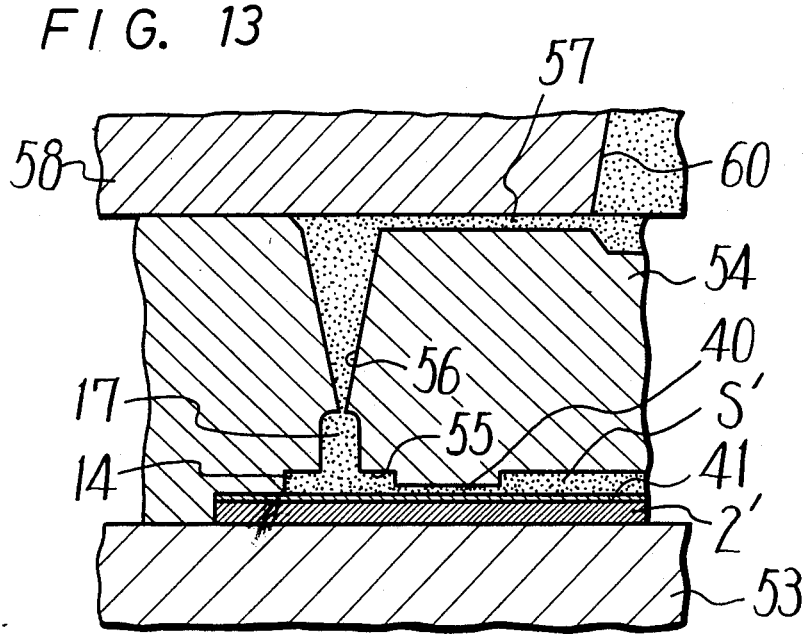
FIG. 13 is an enlarged diagramatic sectional view corresponding to a portion of FIG. 12 which is to the left of its center line.

As is shown particularly on FIG. 13, the surface of mold plate 53 is flat or smooth so as to merely serve as a back up for panel or substrate 2' which is accommodated within the cavity 55 of mold plate 54 with the thermoplastic film 41 thereon facing upwardly, that is, toward recesses of cavity 55 which correspond to the projecting pattern S' to be formed on the back of panel 2'.

In using the molding apparatus of FIGS. 12 and 13, the movable assembly 46 is initially lowered to permit the placement of panel 2' on the surface of mold plate 53 with the thermoplastic film 41 facing upwardly. Then, movable assembly 46 is displaced upwardly to the position shown on FIG. 12 so as to close the mold, that is, bring the land area of mold plate 53 tightly against the land area of mold plate 54, and further to bring plates 54, 58 and 59 of stationary assembly 47 into tight abutting relation with each other against the forces of springs 61 and 62. Then, the molding apparatus 45 is suitably heated and the resin, for example, polyethylene, is injected into cavity 55 from sprue 60 by way of each runner 57 and the respective gate 56. As is shown particularly on FIG. 13, each gate 56 opens into cavity 55 at a location in the latter which corresponds to the upper end of an eventual post 17 of pattern S'. The injected resin fills the cavity 55 by way of the relatively narrow and shallow portions thereof corresponding to the strips 40 which extend between the parts of the cavity which are to define the projections 14a–14c, 15, 16 and 17.

Thereafter, movable assembly 46 is displaced downwardly for opening the mold, that is, for separating mold plate 53 downwardly from mold plate 54. In response to the foregoing, springs 61 move mold plate 54 downwardly through a distance limited by the engagement of mold plate 54 with the heads of bolts 61a, which distance is greater than the downward movement of stripper plate 58 permitted by the engagement of the heads of bolts 63 with attaching plate 59. Thus, springs 61 are effective to separate mold plate 54 from runner stripper plate 58, with the result that the molded body in cavity 55 is cut away at the neck of each gate 56. Further, springs 62 separate runner stripper plate 58 downwardly from attaching plate 59 with the result that the resin solidified in each gate 56 and runner 57 as well as in sprue 60 falls, as a unit from attaching plate 59. Finally, the panel 2' with the projecting pattern S' strongly bonded thereto through the thermoplastic film 41 can be removed, as a unit, downwardly from the cavity 55 of mold plate 54.

The above described convenient separation of the molded body from the solidified resin remaining in mold plate 54 and the convenient removal of the panel or substrate 2' with the molded pattern S' thereon are possible by reason of the communication of each gate 56 with cavity 55 at a location in the latter corresponding to the end of a post 17. The injecting of resin into mold cavity 55 only at one or more locations corresponding to the ends of posts 17 is made possible by the provision, in cavity 55, of recesses corresponding to strips 40 of pattern S', and through which the injected resin can be communicated to all other portions of the cavity. In other words, the recesses of cavity 55 corresponding to strips 40 of the eventual pattern S' function as runners during the injection molding process. Furthermore, the strips 40 of the finished projecting pattern S' serve to increase the bonding of the pattern S' to the panel or substrate 2', as compared with the bonding that would occur in the case where the projecting pattern consisted only of the spacing projections 14a–14c, and the projections 15, 16 and 17, for example, as in FIG. 3. Further, the provision of the mold cavity 55 with the recesses corresponding to the strips 40 of the completed projecting pattern S' facilitates the manufacturing, and hence reduces the cost of the mold plate 54, as it is necessary to provide such mold plate with one or at most a few gates 56. In the absence of the strips 40 in projecting pattern S', it would be necessary to provide so-called pin-point gates, that is, to provide a separate gate for the injection of resin into the portion of cavity 55 corresponding to each of the eventual projections 14a'–14c, 15, 16 and 17.

It will be appreciated that, in accordance with the present invention, as described above, the projecting pattern S' is molded directly and rapidly on the substrate 2', for example, on the front panel of a planar, push-type switching device, whereby the invention is suitably for the mass production of the latter.

Although an illustrative embodiment of the invention has been described in detail herein with reference to the accompanying drawings, it is to be understood that the invention is not limited to that precise embodiment, and that various modifications and changes may be effected therein by one skilled in the art without departing from the scope or spirit of the invention as defined in the appended claims.

What is claimed is:

1. In the method of producing a planar, push-type switching device by providing a front panel with a predetermined pattern projecting from one surface of the panel and having post-shaped parts, interposing a plurality of insulating sheets between a back-up plate and said front panel with said one surface confronting the adjacent one of said sheets and said post-shaped parts extending through respective openings in said sheets and back-up plate, and upsetting the ends of said post-shaped parts for assembling together said front panel, sheets and back-up plate; the improvement comprising providing said pattern projecting from said surface of the front panel by the steps of coating said surface of the front panel with a thermoplastic film;

disposing said surface coated with the thermoplastic film against a mold plate having a cavity in the form of said predetermined pattern opening toward said thermoplastic film and which includes a plurality of effective portions connected by relatively shallow runner portions with at least some of said effective portions being relatively deep and corresponding to said post-shaped parts of the pattern;

injecting material into said cavity through gates having restricted openings into said cavity only at regions of said relatively deep effective portions of the cavity corresponding to ends of said post-shaped parts so as to bond to said surface of the front panel through said thermoplastic film a molded body having said predetermined pattern; and displacing said mold plate and said molded body away from each other to effect clean separation, at said ends of the post-shaped parts, of said molded body from solidified material remaining in said gates.

2. The method according to claim 1; wherein said thermoplastic film is of an olefine.

3. The method according to claim 1; in which said front panel is a flexible plate of metal.

4. The method according to claim 3; in which said metal is stainless steel.

5. The method according to claim 1; wherein said material which is injected is a moldable resin.

6. The method according to claim 5; in which said moldable resin is polyethylene.

* * * * *